United States Patent
Kodama et al.

(10) Patent No.: US 8,159,132 B2
(45) Date of Patent: Apr. 17, 2012

(54) ORGANIC ELECTRO-LUMINESCENSE DISPLAY APPARATUS

(75) Inventors: Mitsufumi Kodama, Tokyo (JP);
Toshiaki Maruoka, Tokyo (JP);
Shigeyuki Ishiguro, Tokyo (JP); Toshio Hayakawa, Tokyo (JP); Yosuke Mizutani, Tokyo (JP)

(73) Assignee: TDK Corporation, Tokyo (JP)

( * ) Notice: Subject to any disclaimer, the term of this patent is extended or adjusted under 35 U.S.C. 154(b) by 61 days.

(21) Appl. No.: 12/786,977

(22) Filed: May 25, 2010

(65) Prior Publication Data

US 2010/0301743 A1     Dec. 2, 2010

(30) Foreign Application Priority Data

May 28, 2009   (JP) ................. 2009-129498

(51) Int. Cl.
*H05B 33/00* (2006.01)
*H01J 1/62* (2006.01)
(52) U.S. Cl. ....................... 313/512; 313/504
(58) Field of Classification Search ........... 313/498–512
See application file for complete search history.

(56) References Cited

U.S. PATENT DOCUMENTS
2009/0066871 A1   3/2009   Nakamura et al.

FOREIGN PATENT DOCUMENTS

| | | |
|---|---|---|
| JP | 2003-100446 | 4/2003 |
| JP | 2004-30974 | 1/2004 |
| JP | 2004-103337 | 4/2004 |
| JP | 2007-273409 | 10/2007 |
| JP | 4114895 | 4/2008 |
| JP | 2008-311239 | 12/2008 |
| JP | 2009-20129 | 1/2009 |
| KR | 2009-0027580 | 3/2009 |

OTHER PUBLICATIONS

Korean Office Action mailed on Nov. 24, 2011, in Korean Application No. 10-2010-0049480.

*Primary Examiner* — Joseph L Williams
(74) *Attorney, Agent, or Firm* — Oblon, Spivak, McClelland, Maier & Neustadt, L.L.P.

(57) ABSTRACT

An organic EL display apparatus includes a display unit having a plurality of organic EL elements two-dimensionally arranged on a substrate, where the organic EL elements provide pixels, a sealing plate configured to be adhered to the substrate with an adhesive to cover the display unit, and a plurality of lead wires disposed on the substrate such that the lead wires are drawn outward from the display unit to the outside of the sealing plate. A linear bank is formed along an adhesion zone defined on the substrate to extend across the lead wires in a region where these lead wires are disposed. The sealing plate has its periphery adhered to the adhesion zone on the substrate along the adhesion zone on the substrate.

12 Claims, 7 Drawing Sheets

ORGANIC ELECTRO-LUMINESCENSE DISPLAY APPARATUS

BACKGROUND OF THE INVENTION

The present invention relates to an organic EL display apparatus, and more particularly, to a sealing structure for securing a sealing plate using an adhesive in such a manner that the sealing plate covers an organic EL display unit formed on a substrate.

Organic electro-luminescence (hereinafter called "organic EL") display apparatuses which make use of a light emitting phenomenon of organic substance have been progressively developed in recent years as display apparatuses of next generation by virtue of their advantageous features over liquid crystal displays and plasma displays, including increasingly more potential reduction in thickness, wider angle of view, higher luminance, higher definition, low power consumption, and the like. Organic EL display apparatuses have been commercially available for displays of a variety of electronic devices, for example, a television set, a car navigation system, a portable terminal, and the like.

Such an organic EL display apparatus comprises a display screen which is constructed by forming a light emitting element (organic EL element) on a pixel-by-pixel basis so as to sandwich an organic substance, which serves as a light emitter, between both negative and positive electrodes, and arranging these light emitting elements over a two-dimensional plane. A display unit which includes these multiple organic EL elements so arranged is hermetically sealed by covering the display unit with a sealing plate made of glass, metal or the like. Such hermetic sealing is required because organic EL materials generally tend to be affected by moisture, and the light emitting elements would be deteriorated if they were exposed to external air, leading to detrimental effects on the display quality and lifetime of the products.

For reference, Japanese Patent No. 4114895 and JP-A-2007-273409 disclose such organic EL display apparatuses and techniques related to sealing structures.

SUMMARY OF THE INVENTION

Notably, in the organic EL display apparatus which involves the sealing with the sealing plate as mentioned above, the adhesive can fail to completely spread over the entire periphery of the display unit in some cases in a process of adhering the sealing plate, giving rise to defective sealing, particularly at such sites through which lead wires are extended.

Specifically, FIGS. 8 and 11 are top plan views showing a portion of a conventional organic EL display apparatus (a region including a corner of a display unit, which is comparable to a portion B in FIG. 1, later described) in enlarged view, and FIGS. 9A-9C and FIG. 10 are cross-sectional views showing steps of a sealing process for a conventional organic EL display apparatus in order (FIGS. 9A-9C show cross-sectional views taken along C2-C2 in FIG. 8, while FIG. 10 shows a cross-sectional view taken along C3-C3 in FIG. 11). In these figures, components identical or comparable to those in embodiments (in FIGS. 1 through 7), later described, are designated the same reference numerals. Also, the sealing plate is not illustrated in FIG. 8 or FIG. 11, and a peripheral part 13a of the sealing plate (along which the sealing plate is adhered) alone is indicated by a two-dot chain line.

As shown in these figures, in the sealing process, after forming a display unit 12 on a substrate 11 and wires (lead wires) 25, 26 extended from the display unit 12 for driving the display unit 12 (FIG. 9A), an adhesive 14a is applied along the peripheral part 13a of the sealing plate 13, and this sealing plate 13 is attached to the substrate 11 (FIGS. 9B-9C). Then, ultraviolet rays are irradiated from the back of the substrate 11 (from the image display side of the display apparatus or from the lower side of FIG. 9C) to cure the adhesive 14a to adhere the sealing plate 13 (peripheral part 13a of the sealing plate 13) to the substrate 11.

However, in a region 14 of the substrate 11 which is applied with the adhesive 14a (a so-called overlap width), multiple lead wires 25, 26 are arranged to extend from the display unit 12 so as to traverse this region (see FIG. 8). Also, due to a demand for a reduction in size and an increase in luminance for a display apparatus, a reduction in resistance may be attempted by using a variety of materials for the wires 25, 26 or by increasing the thickness of the wires 25, 26. As such, depending on the type of wiring material and on the interval, thickness and the like of the wires 25, 26, the adhesive 14a fails to continuously extend between the substrate 11 and the sealing plate 13 (peripheral part 13a) beyond the wires 25, 26, or the adhesive 14a fails to completely fill in between the wires. Consequently, the adhesive 14a is blocked by the wires 25, 26 and broken in the middle, as shown in FIG. 10.

Such a broken adhesive can be thought to be also attributable to metal electrodes which exhibit a lack of wettability to the adhesive 14a, i.e., the nature of metal electrodes which in general exhibit poor affinity for the adhesive and tend to repel the adhesive. The broken adhesive 14a, if any, would cause a hole 14b which continues from the outside into the interior of the sealing plate 13, as shown in FIG. 10, even if the sealing plate 13 is successfully fixed onto the substrate 11, and external air would intrude into the interior of the sealing plate 13 through this hole 14b (see arrow M in FIG. 11) and possibly cause the display unit 12 to deteriorate.

From the fact that the intrusion of even a trace of moisture into an organic EL display apparatus will cause a change in quality of the organic EL material itself, which is a light emitting material, or cause peeling between a light emitting layer and electrodes to significantly affect the quality of displayed images and the lifetime of the display unit (and accordingly the overall apparatus), it is important for the organic EL display apparatus to ensure the completeness of sealing from a viewpoint of increasing the reliability of the organic EL display apparatus.

It is therefore an object of the present invention to enable a sealing plate to be more reliably adhered to increase the reliability of an organic EL display apparatus.

To solve the foregoing problem and achieve the object, an organic EL display apparatus according to the present invention comprises a display unit including a plurality of organic EL elements two-dimensionally arranged on a substrate, where the organic EL elements provide pixels, a sealing plate configured to be adhered to the substrate with an adhesive to cover the display unit, a plurality of lead wires disposed on the substrate such that the lead wires are drawn outward from the display unit to the outside of the sealing plate, and a linear bank formed along an adhesion zone defined on the substrate. The sealing plate has its periphery adhered to the adhesion zone on the substrate along the adhesion zone on the substrate, and the linear bank extends across the lead wires in a region where these lead wires are disposed.

The organic EL display apparatus of the present invention comprises a linear bank formed in the adhesion zone on the substrate, along which the sealing plate is adhered to the substrate. The linear bank protrudes from the surface of the substrate and extends along the adhesion zone. Here, the adhesion zone refers to a region on the substrate for use in attaching the sealing plate to the substrate for adhesion (so-called overlap width). For covering the display unit (area for displaying images) which has the organic EL elements arranged to provide pixels with the sealing plate to hermetically seal the display unit from the outside, this adhesion zone extends in long, narrow strip along the overall periphery of the display unit to surround the display unit. In this adhesion zone, the sealing plate is adhered to the substrate with an adhesive interposed between the substrate and a peripheral region of the sealing plate.

In addition, a plurality of lead wires are drawn from the display unit outward to the periphery of the display unit for driving the display unit (organic EL elements). These lead wires are disposed on the substrate such that they traverse the adhesion zone across an inner area which receives the display unit and is covered with the sealing plate as well as an outside area of the sealing plate. In the present invention, the aforementioned linear bank is disposed in a portion of the adhesion zone through which the lead wires extend.

This linear bank (hereinafter simply called the "bank" in some cases) serves to guide the adhesive applied between the periphery of the sealing plate and the substrate in the adhesion zone toward the surface of the substrate between the lead wires. More specifically, a plurality of lead wires are drawn from the display unit outward and disposed in the adhesion zone such that they run across the adhesion zone, as described above. In conventional sealing structures, since difficulties are experienced in introducing an adhesive into spaces between these lead wires, the adhesive possibly fails to fall down onto the surface of the substrate in some portions between the wires. To coop with this trouble, the linear bank may be disposed to guide the adhesive along the surface (particularly, side surfaces) of the bank into spaces between the wires, allowing the adhesive to more readily reach the surface of the substrate. Consequently, the linear bank can prevent the hole 14b as shown in FIGS. 10 and 11.

The linear bank is not necessarily limited to a particular shape, but preferably has one or both side surfaces thereof which lead an inclined surface (s) that declines from the top end to the bottom end of the side surface (s). The side surface of the linear bank may be a vertical surface such as that vertically upstanding from the surface of the substrate, but the linear bank is designed to have an inclined surface which declines as described above because such an inclined surface facilitates the adhesive to more readily fall down along the inclined surface to the surface of the substrate between the conductive wires.

Such a linear bank can be created, for example, by making the cross section (cross section which intersects perpendicularly with the direction in which the bank extends or with the lengthwise direction of the same, or cross section in the width direction) of the linear bank gradually wider from the peak of the bank toward the bottom, or stated in another way, by forming the linear bank into a trapezoidal shape which has the bottom side larger than the top sided.

Further, preferably, one or both side surfaces of the lead wire are also designed to have a similar inclined surface (s) to that of the linear bank at least in the adhesion zone, i.e., the lead wire is designed to have an inclined side surface (s) which declines. This is because such lead wires facilitate the adhesive to reach the surface of the substrate in a manner similar to the linear bank.

Also, in the present invention, the linear bank is preferably formed thicker than the lead wires, in other words, the linear bank is positioned at a level (level of the peak of the bank from the surface of the substrate) higher than the level of the lead wires (the level of the peak of the lead wires from the surface of the substrate). When the linear bank is formed thicker than the lead wires in this way, the upper end of the bank continues at a position higher than the top surface of the lead wires (without being broken by the wires), thus allowing the adhesive to smoothly fall down from the top surface of the linear bank to the side surfaces and more readily spread between the wires.

Also, in the present invention, the linear bank is preferably positioned at a level (from the surface of the substrate) lower than the level of a bottom surface of a peripheral part of the sealing plate (from the surface of the substrate) when the sealing plate is adhered to the substrate. This is because the adhesive is prevented from being broken by the linear bank in the middle in the width direction of the adhesion zone so that the adhesive is continuously applied over the entire width of the adhesion zone, thereby more reliably ensuring the reliability of the sealing and the strength of adhesion.

Also, the linear bank preferably has a width which is limited to one-half or less of the width of the adhesion zone from a view point of ensuring the strength of adhesion in a similar manner and preventing a moisture-resistant effect (effect of blocking moisture from intruding) from being exacerbated by the adhesive. Further, the bank is preferably positioned to extend along the adhesion zone (in parallel with the adhesion zone) at a substantially central position of the adhesion zone in the width direction. Such positioning of the bank is intended to allow the adhesive to uniformly fall down on both sides of the bank along both side surfaces of the linear bank in the adhesion zone and reach the surface of the substrate, thus more reliably sealing the display unit.

Further, the bank is preferably made of a material which can be patterned (formed into a pattern) from the ease of formation. Also, the linear bank is preferably made of the same material as an insulating material disposed on the display unit. With the use of the same material as the insulating material disposed on the display unit, the linear bank can be formed simultaneously in a process for disposing the insulating material on the display unit, thus making it possible to apply the present invention without increasing the number of processes required to manufacture the display apparatus. The linear bank can be made using an insulating material, for example, photoresist, polyimide, acrylic resin and the like.

Also, the bank is not limited to one, but the organic EL display apparatus may comprise a plurality of linear banks which extend substantially in parallel with one another. In this event, each bank need not be continuous, and the organic EL display apparatus may comprise, for example, at least two or more linear banks which are discontinuously formed (in an interruptive manner) in a lengthwise direction. However, when such discontinuous banks are formed, linear banks are preferably disposed in a staggered configuration such that the two banks do not disappear (such that any linear bank exists) when viewed from a width direction of the adhesion zone (direction orthogonal to a direction in which the adhesion zone extends) from a viewpoint of preventing the broken adhesive.

Notably, the object of the present invention can be achieved when the bank is simply formed in a portion of the adhesion zone in which lead wires are disposed in the present invention, but the present invention does not exclude an apparatus which comprises a linear bank formed not only in such a portion in which the lead wires are disposed but also in another portion of the adhesion zone (for example, within the adhesion zone around the periphery of the display unit to surround the display unit), and such an apparatus also falls within the scope of the present invention.

The lead wire is typically an auxiliary electrode, i.e., an electrode electrically connected to one of electrodes (anodes or cathodes) disposed to sandwich an organic EL layer of the display unit to supply electric power to the organic EL layer, and drawn out to the periphery of the display unit, but the lead wire is not so limited. The lead wires, as referred to in the present invention, include a variety of wires which are disposed to traverse the adhesion zone, for example, an electrode extended from an anode or a cathode (electrode continuous to the anode or cathode) and the like. The lead wires may be made of a material, for example, aluminum, gold, silver, copper, an alloy of any of these elements, and another conductive material, and the lead wires is not particularly limited to any material. Also, the lead wires may be made of a single material, or may be a laminate electrode made up of two or more laminated conductive materials.

Further, the adhesive is not particularly specified in type as long as it can adhere the sealing plate to seal the display unit. For example, other than an ultraviolet-setting adhesive (for example, an acrylic-based or an epoxy-based ultraviolet-setting resin) which is set by irradiating the same with ultraviolet rays, another light-setting or thermo-setting adhesive can be used as well. However, for avoiding the influence on the display unit (deterioration in characteristics of the organic EL elements due to heat), a light (ultraviolet) setting adhesive is more preferably used than a thermo-setting adhesive.

Also, the sealing plate, whichever name is used to designate it, includes a variety of members for protecting the display unit from an external environment (for example, the member may be referred to as a "sealing can," a "substrate," or any other name). While the sealing plate is not particularly limited in material, metal (SUS or the like), glass, or resin can be used by way of example. Further, the substrate formed with the display unit on its surface can be made, for example, of glass, quartz, resin, or the like.

The display unit may vary in structure. For example, the display unit may be driven by any of a passive matrix method and an active matrix method. In regard to the mode of display light emission, the display apparatus may employ a top emission mode for emitting the display light on the top side, or a bottom emission mode for emitting the display light on the bottom side, or a see-through display which is capable of emitting the display light on both sides. Also, for implementing a color display, the display apparatus may employ a color filter method, a three-primary-color emission method, or any other method.

According to the present invention, the adhesive for adhering the sealing plate can be prevented from being broken to improve the reliability of sealing in the organic EL display apparatus.

Other objects, features, and advantages of the present invention will be made more apparent from the following description of embodiments of the present invention which is made in connection with the drawings. It should be apparent to those skilled in the art that the present invention is not limited to the embodiments described below but can be changed in various manners within the scope of the appended claims. In the drawings, the same reference numerals indicate the same or corresponding parts.

DESCRIPTION OF THE EMBODIMENTS

Figure 1:
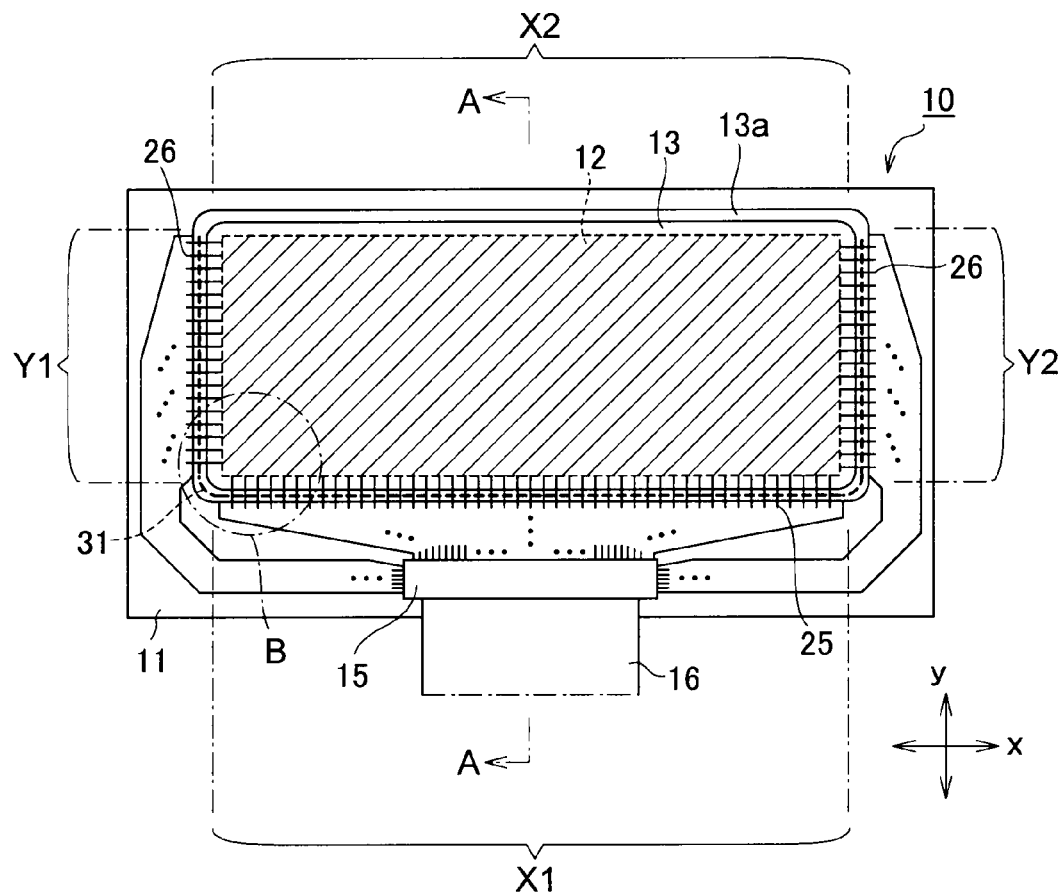
FIG. 1 is a top plan view schematically showing an organic EL display apparatus according to one embodiment of the present invention.
Figure 2:
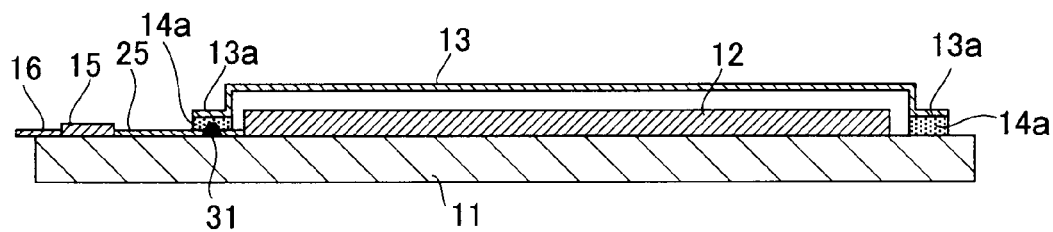
FIG. 2 is a cross-sectional view of the structure (taken along A-A) of the organic EL display apparatus according to the embodiment.
Figure 3:
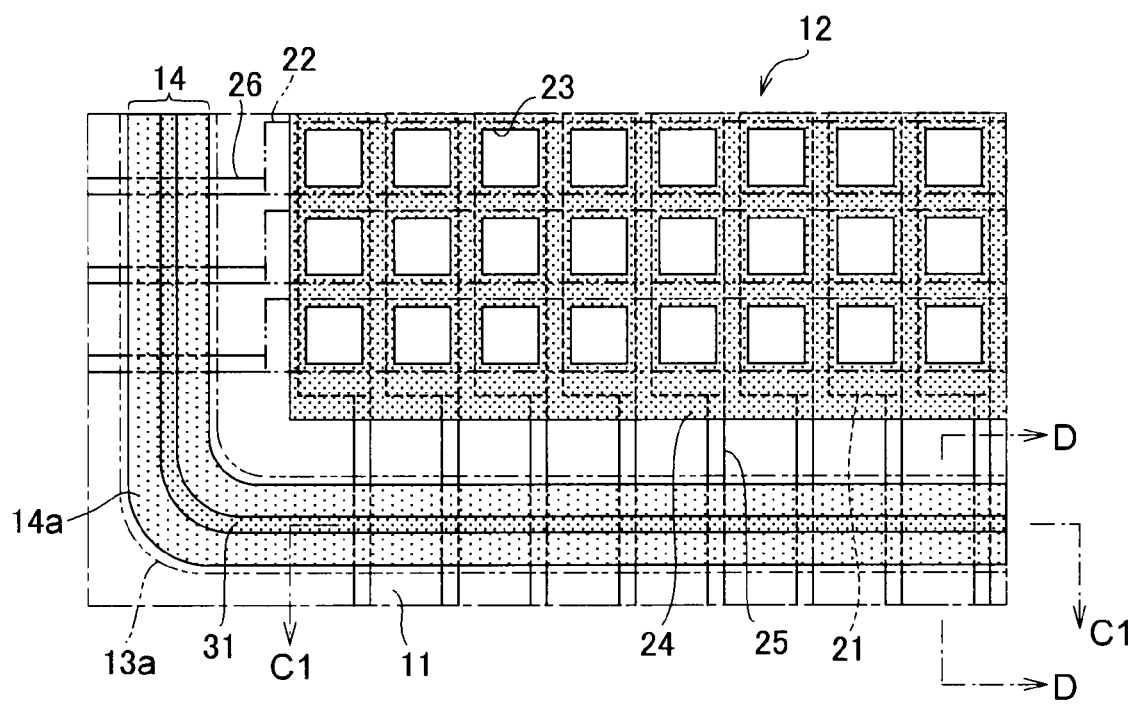
FIG. 3 is a top plan view schematically showing a portion (portion B in FIG. 1) of the organic EL display apparatus according to the embodiment in enlarged view.

As shown in FIGS. 1 through 3, an organic EL display apparatus 10 according to one embodiment of the present invention comprises a optically transparent, flat glass substrate 11 (hereinafter simply called the "substrate" in some cases); an organic EL display unit 12 (hereinafter called the "display unit") formed on the surface of the glass substrate 11; a sealing plate 13 for covering and sealing the display unit 12; an integrated circuit (IC) 15 for driving the display unit 12; and a flexible printed circuit board (FPC) 16 connected to the IC 15.

The display unit 12 comprises a plurality of organic EL elements, which provide pixels, arranged on a two-dimensional plane, i.e., in the horizontal direction (x-direction in FIG. 1) and in the vertical direction (y-direction in FIG. 1) in a matrix shape such that images can be displayed thereon. The display unit 12 is formed by sequentially laminating an anode (transparent electrode made, for example, of ITO) 21, an insulating film 24, a hole injection layer (not shown), a hole transport layer (not shown), an organic EL layer (not shown) which serves as a light emitting layer, an electron transport layer (not shown), an electron injection layer (not shown), and a cathode 22 on the glass substrate 11 in this order.

Notably, in this embodiment, the organic EL element display unit is implemented by a five-layer structure (including the hole injection layer, hole transport layer, light emitting layer (organic EL layer), electron transport layer, and electron injection layer) as described above, but, another structure may be employed instead for the organic EL element display unit, for example, a three-layer structure (including a hole transport layer, a light emitting layer, and an electron transport layer) where the transport layers also serve as respective injection layers. Additionally, a variety of other structures may be employed for the display unit 12, such as providing a plurality of light emitting layers which differ in light emitting wavelength from one another, or providing a color filter, a black matrix layer, a polarizer, and the like. Also, the display apparatus 10 of this embodiment is of a bottom emission mode for emitting display light from the back side of the glass substrate 11, and employs a passive matrix method for driving the display unit 12. However, as previously described, the display unit 12 itself may take any of other various configurations.

Around the display unit 12, a plurality of auxiliary electrodes 25, 26 are disposed such that they are extended outward from the display unit 12 for electrically connecting the display unit 12 with the driving IC 15. Among these auxiliary electrodes 25, 26, auxiliary electrode 25 drawn from one long side X1 of the rectangular flat display unit 12 serves to electrically connect each anode (ITO) 21 of the display unit 12 to the IC 15, while the auxiliary electrodes 26 drawn respectively from short sides Y1, Y2 of the display unit 12 serve to electrically connect the anodes 22 of the display unit 12 to the IC 15.

Each of the auxiliary electrodes 25, 26 associated with these anodes and cathodes, is formed on the substrate 11 by photolithography technologies after the anodes 21 have been formed. Specifically, an electrode film is first deposited on the surface of the glass substrate 11 by a so-called thin-film formation technology such as sputtering for forming the anodes 21. Then, this electrode film is patterned to provide a plurality of linear electrodes arranged in parallel with one another to form a number of anodes 21 corresponding to the number of pixels. Subsequently, auxiliary electrodes 25 associated with the anodes are formed in a pattern such that they can be later connected to the anodes 21, while the auxiliary electrodes 26 associated with the cathodes are formed in a pattern such that they can also be later connected to the cathodes 22, both by known photolithography technologies (including applying a resist, exposing and developing the resist through a mask pattern, and etching the electrode film into the electrodes).

Alternatively, these auxiliary electrodes 25, 26 may be implemented by laminate electrodes which comprise, for example, a barrier layer, an electrode body layer, and a barrier layer laminated in order (in a structure having the electrode body layer sandwiched between the barrier layers). In this structure, each barrier layer may be formed using, for example, Mo alloy, TiN, W, Ta or the like. The electrode body layer, in turn, may be formed using, for example, Al, Ag, Au, Cu, or alloys of these elements.

The sealing plate 13 has a substantially rectangular flat shape larger than the display unit 12 such that the sealing plate 13 can cover the top and surroundings of the display unit 12, and comprises a frame-like peripheral part 13a, the perimeter (four sides) of which is stepped to define a space for accommodating the display unit 12 within the sealing plate 13 and which can be adhered to the surface of the substrate 11. Also, while this sealing plate 13 is made of SUS (stainless steel) in this embodiment, the sealing plate 13 may also be made of another material, for example, glass which can block external air.

An adhesion zone (overlap width) 14 defines a region on the substrate 11 which opposes the peripheral part 13a of the sealing plate 13, and which is adhered to the peripheral part 13a of the sealing plate 13. This adhesion zone 14, which has a substantially uniform width, extends in long, narrow strip along the overall periphery of the display unit 12 to surround the display unit 12. In this adhesion zone 14, sealing plate 13 is adhered to the substrate 11 with the adhesive 14a interposed between the substrate 11 and the sealing plate peripheral part 13a.

Figure 8:
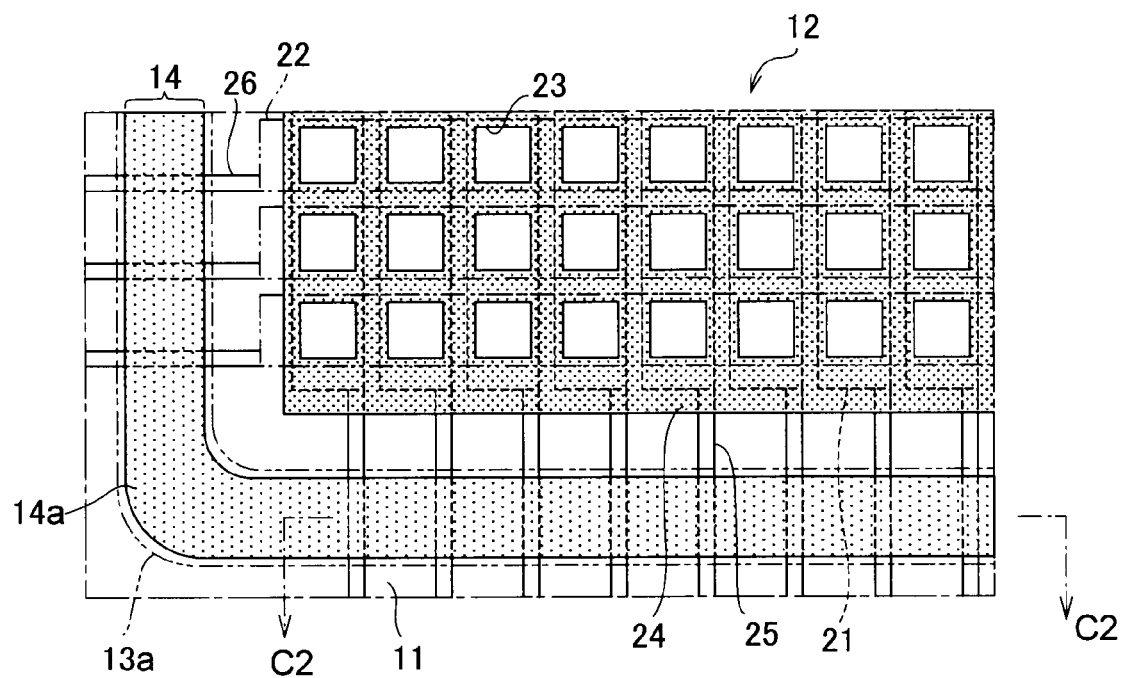
FIG. 8 is a top plan view schematically showing a portion of a conventional organic EL display apparatus (a region near a corner which is comparable to the portion B in FIG. 1) in enlarged view.
Figure 9A:
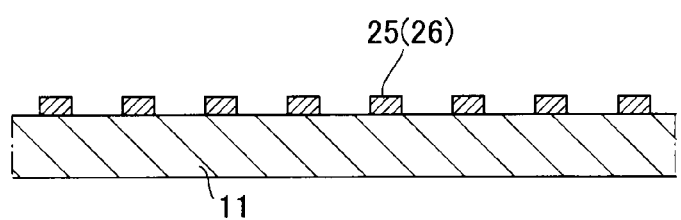
FIG. 9A is a cross-sectional view (taken along C2-C2 in FIG. 8) schematically showing a step in a sealing process (after auxiliary electrodes have been formed on a substrate) in the conventional organic EL display apparatus.
Figure 9B:
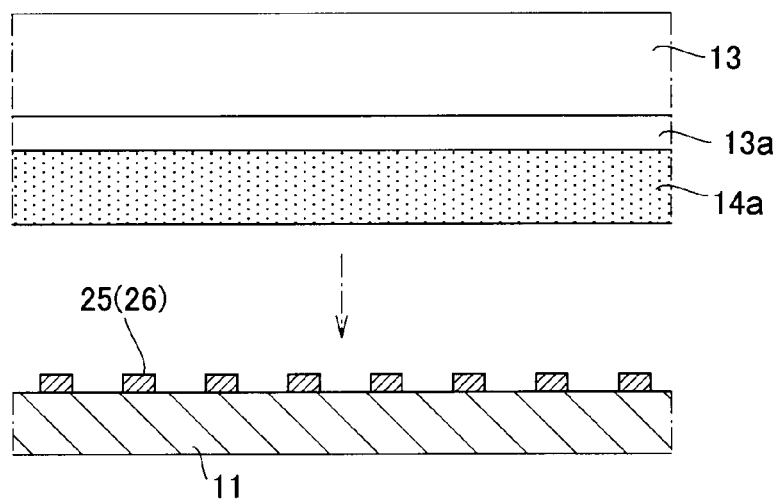
FIG. 9B is a cross-sectional view (taken along C2-C2 in FIG. 8) schematically showing a step in the sealing process (after an adhesive has been coated on the sealing plate) in the conventional organic EL display apparatus.
Figure 9C:
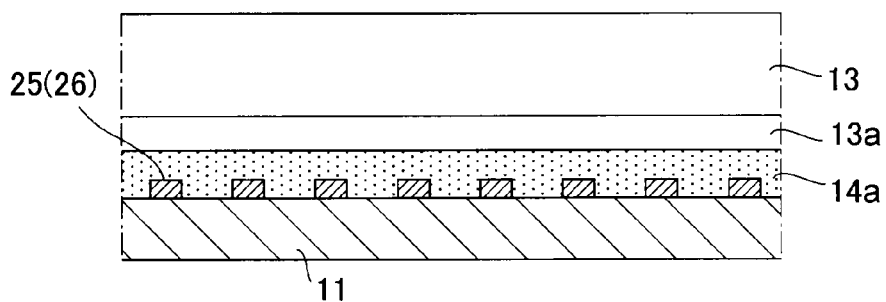
FIG. 9C is a cross-sectional view (taken along C2-C2 in FIG. 8) schematically showing a step in the sealing process (after the sealing plate has been adhered) in the conventional organic EL display apparatus.
Figure 10:
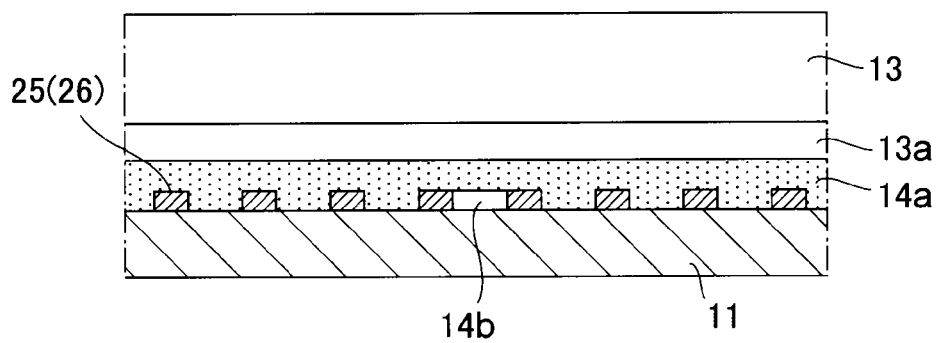
FIG. 10 is a cross-sectional view (taken along C3-C3 in FIG. 11) showing defective sealing (where the sealing plate has been adhered) which has occurred in the conventional organic EL display apparatus.
Figure 11:
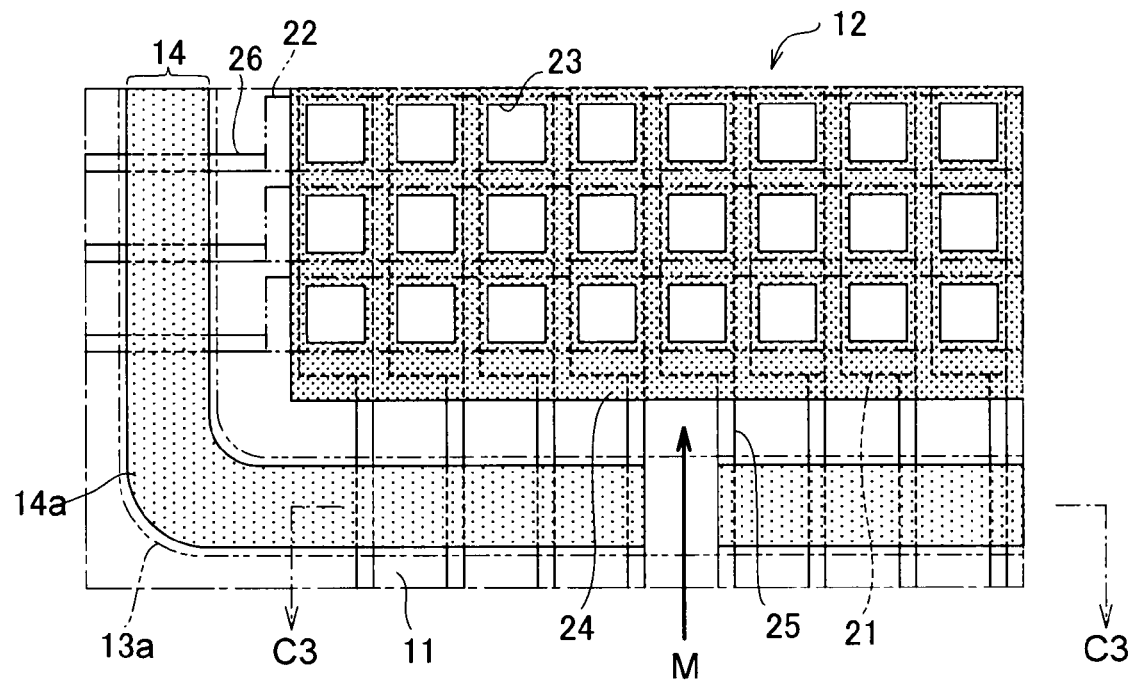
FIG. 11 is a top plan view (comparable to the portion B in FIG. 1) showing the defective sealing which has occurred in the conventional organic EL display apparatus.

Also, within the adhesion zone 14, on one of the long sides X1 and both sort sides Y1, Y2 of the display unit 12, the auxiliary electrodes 25, 26 are disposed respectively in such a manner that they are drawn outward from an internal space covered by the sealing plate 13 and traverse the adhesion zone 14, as previously described. In this embodiment, unlike the conventional display apparatus shown in FIG. 8, linear bank 31 is provided in portions of the adhesion zone 14 in which the auxiliary electrodes 25, 26 are disposed, i.e., the adhesion zone 14 which borders the three sides (one long side X1 and a pair of short sides Y1, Y2) of the display unit 12.

Figure 4:
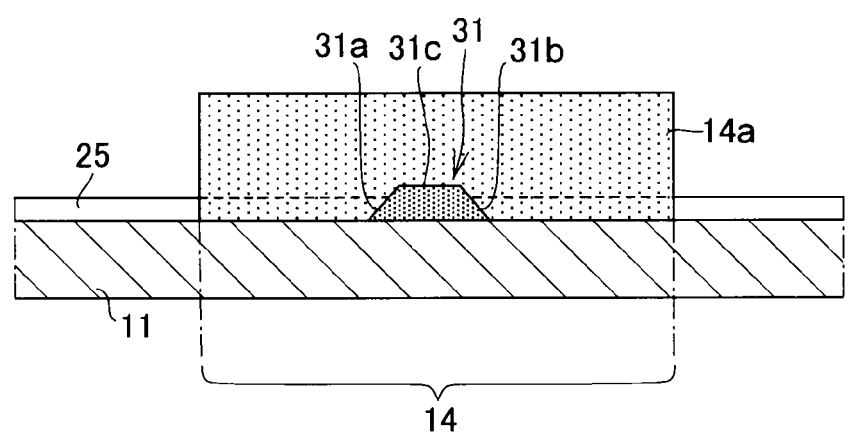
FIG. 4 is a cross-sectional view (taken along D-D in FIG. 3) schematically showing a step in a sealing process using a sealing plate (after linear bank has been formed and an adhesive has been applied, where the sealing plate is not illustrated)

This linear bank 31 is formed on the substrate 11 to have a substantially uniform width, such that it protrudes upward from the surface of the substrate 11, and extends substantially perpendicularly to lead wires 25, 26 and in parallel with the adhesion zone 14 (along the adhesion zone 14) at a substantially central position of the adhesion zone 14 in the width direction. The linear bank 31 has a width smaller than the width of the adhesion zone 14 (for example, one-half or less of the width of the adhesion zone 14), and has a height larger than the lead wires 25, 26. Also, the bank 31 is designed to have a trapezoidal cross section, as shown in FIG. 4, so that both left and right side surfaces 31a, 31b of the linear bank 31 (the left- and right-hand side surfaces toward the lengthwise direction of the linear bank 31) are divergent surfaces which decline from a top surface 31c of the bank 31 toward the surface of the substrate 11. This is intended to facilitate the adhesive 14a to fall down toward the surface of the substrate 11. The linear bank 31 is typically made of photoresist. Alternatively, another insulating material can be used for the linear bank 31, other than photoresist, for example, polyimide, acrylic resin and the like, as previously described.

Figure 5A:
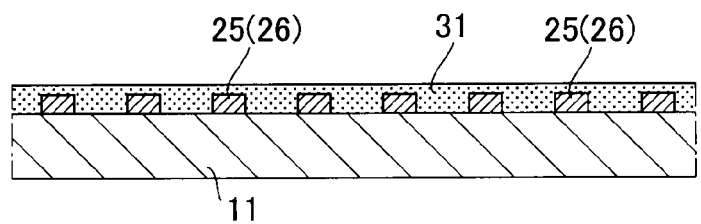
FIG. 5A is a cross-sectional view (taken along C1-C1 in FIG. 3) schematically showing a step in the sealing process using the sealing plate (after the linear bank has been formed)

For forming the linear bank 31, after forming the auxiliary wires 25 (26) on the substrate 11, the linear bank 31 may be formed simultaneously with the insulating film (photoresist film) 24 when it is formed on the display unit 12, as shown in FIG. 5A. Specifically, after forming the auxiliary wires 25 associated with the anodes and the auxiliary wires 26 associated with the cathodes on the substrate 11 as described above, the insulating film (photoresist film) 24 is deposited to include openings 23 for forming pixels on the anodes of the display unit 12, as shown in FIG. 3, where the linear bank 31 may be patterned and formed together with the insulating film 24 (with the same material).

Figure 5B:
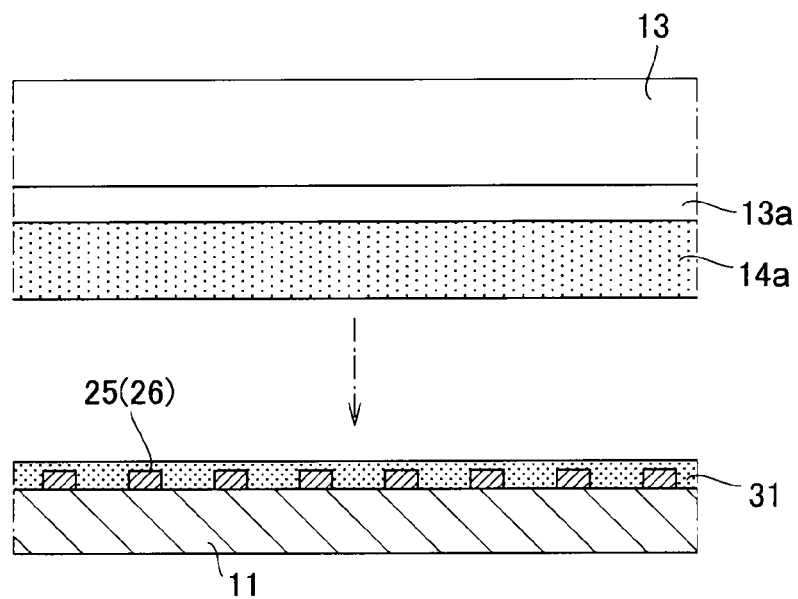
FIG. 5B is a cross-sectional view (taken along C1-C1 in FIG. 3) schematically showing a step in the sealing process using the sealing plate (after an adhesive has been coated on the sealing plate)
Figure 5C:
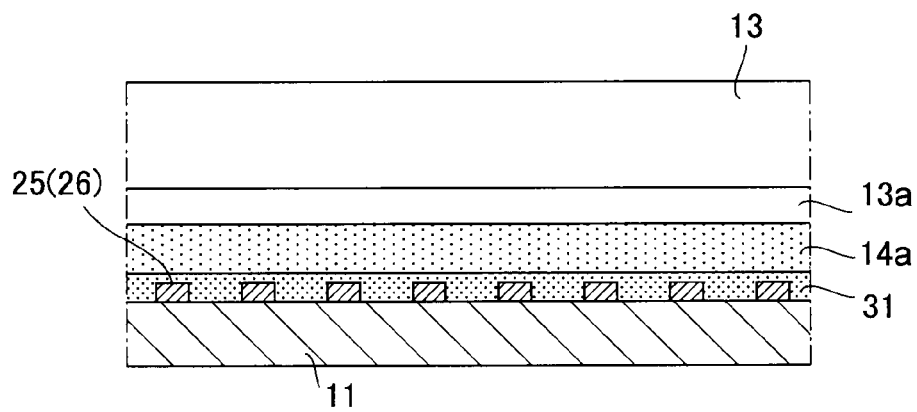
FIG. 5C is a cross-sectional view (taken along C1-C1 in FIG. 3) schematically showing a step in the sealing process using the sealing plate (after the sealing plate has been adhered)
Figure 6A:
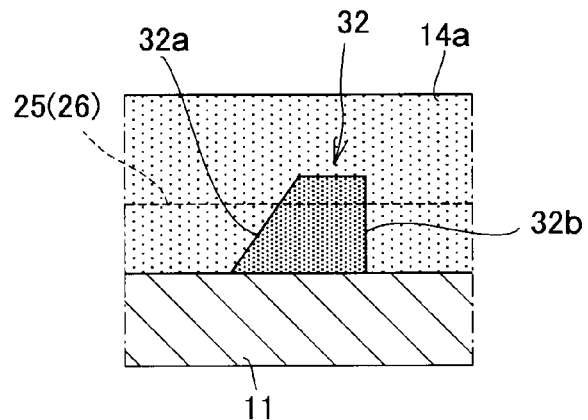
FIG. 6A is a cross-sectional view (taken along D1-D1 in FIG. 3, without illustrating the sealing plate) showing another exemplary shape of the linear bank according to the present invention in enlarged view.

For sealing, the adhesive 14a is coated on the bottom surface of the peripheral part 13a of the sealing plate 13 (surface opposite to the substrate 11), as shown in FIG. 5B, to adhere the sealing plate 13 to the substrate 11. In this event, in the apparatus of this embodiment, since the linear bank 31 has been formed in the adhesion zone 14 on the substrate 11, as shown in FIGS. 3 and 4, the adhesive 14a spreads downward from the top surface 31c of the linear bank 31 along the side surfaces 31a, 31b, is introduced into spaces between the auxiliary wires 25 and 26, and smoothly reaches the surface of the substrate 11. Then, when the sealing plate 13 has been adhered as shown in FIG. 5C, a satisfactory sealing state can be accomplished without broken adhesive or holes between the wires 25, 26. In this regard, FIGS. 3 and 4 do not illustrate the sealing plate (FIGS. 6A-6C, later described, do not either), and FIG. 3 indicates only the peripheral part 13a of the sealing plate (along which the sealing plate is adhered) by a two-dot chain line.

Figure 6B:
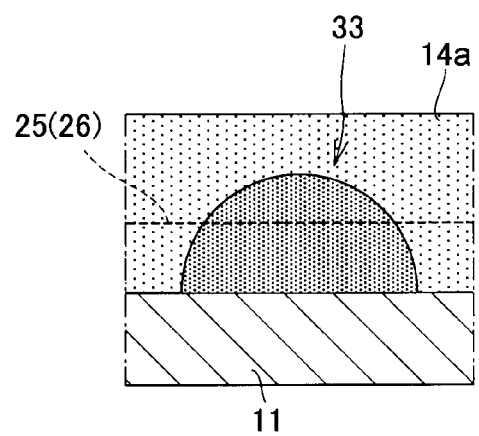
FIG. 6B is a cross-sectional view (taken along D1-D1 in FIG. 3, without illustrating the sealing plate) showing another exemplary shape of the linear bank according to the present invention in enlarged view.
Figure 6C:
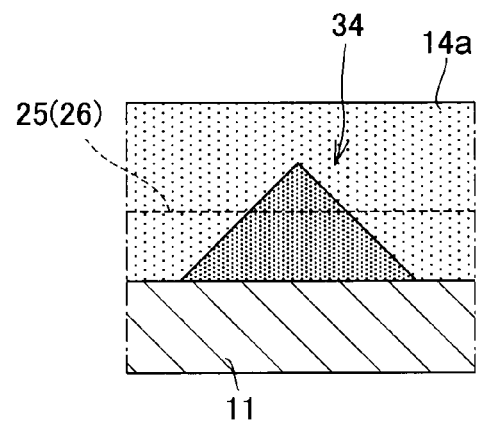
FIG. 6C is cross-sectional view (taken along D1-D1 in FIG. 3, without illustrating the sealing plate) showing a further exemplary shape of the linear bank according to the present invention in enlarged view.

In this embodiment, the linear bank 31 is designed to have a trapezoidal shape (cross section) so that both side surfaces 31a, 31b are divergent. Alternatively, the linear bank 31 may have the cross section in a variety of shapes, for example, a bank 32 shown in FIG. 6A which has only one divergent side surface 32a (the other side surface 32b is a vertical surface), a semi-circular bank 33 as shown in FIG. 6B, or a bank 34 having a triangular cross section as shown in FIG. 6C. Also, giving an example of a preferred combination of respective materials (material for the wires and material for the bank) in the adhesion zone 14, the linear bank 31 is formed of photoresist or polyimide when the body layer of the wires 25, 26 is formed of an Al alloy, and the barrier layer of the wires 25, 26 is formed of a Mo alloy or TiN.

Figure 7:
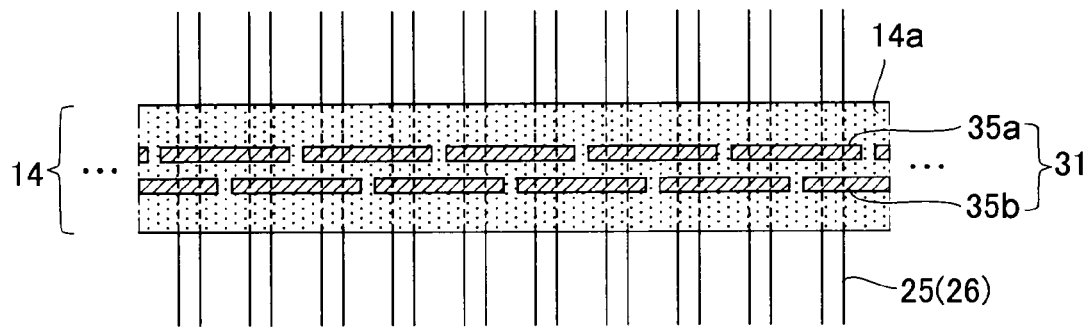
FIG. 7 is a top plan view showing another exemplary layout of the linear bank according to the present invention.

The linear bank is not limited to one, but a plurality of linear banks may be provided. In this event, the linear banks 31 may not be continuous (discontinuous) in the lengthwise direction thereof, as shown in FIG. 7. However, for forming such discontinuous banks 31 (35a, 35b), a plurality of these banks 35a, 35b are preferably formed such that any of the banks 35a or 35b exists in the direction in which the wires 25 (26) extend (in the vertical direction on the sheet of FIG. 7) (such that respective banks 35a, 35b are not cut at the same position) in order to introduce the adhesive 14a between the wires 25 (26) without fail.

In the designing and manufacturing of conventional organic EL display apparatus, an idea has prevailed, as a common sense, that any material or structure should not be introduced into the adhesive zone except for the adhesive, in the excess of fear to exacerbate the reliability of sealing (strength of adhesion). In contrast, the present invention overcomes such an idea, and boldly provides a structure in the adhesion zone other than the adhesive, and thereby eliminates defects in the adhesive sealing. In regard to the effect of improving the defective sealing, broken adhesives were found in 0.3% of conventional display apparatuses which did not comprise the linear banks, whereas such broken adhesives can be completely eliminated by applying the present invention to the display apparatuses and providing the linear banks therein.

An assessment was made to see whether or not a sealing plate would be affected in strength of adhesion by a structure (linear bank) provided in the adhesion zone other than the adhesive, as done in the present invention. In this assessment, a load was applied to a lower right corner of the glass substrate 11 in FIG. 1 with the left half of the display apparatus 10 being sandwiched, and a measurement was made for the load which caused the sealing plate 13 to peel off from the glass substrate 11. The result of the assessment shows that substantially the same load caused the pealing in both the display apparatus provided with the linear bank 31 and the conventional display apparatus without the linear bank 31. Accordingly, no significant difference was observed in the strength of adhesion of the sealing plate 13 by the provision of the linear bank 31.

As described above, the present invention can provide a practically useful technique which eliminates defects in the sealing in an organic EL display apparatus and can improve the manufacturing yield rate of the organic EL display apparatus.

What is claimed is:

1. An organic EL display apparatus comprising:
   a display unit including a plurality of organic EL elements two-dimensionally arranged on a substrate, said organic EL elements configured to provide pixels;
   a sealing plate configured to be adhered to said substrate with an adhesive to cover said display unit;
   a plurality of lead wires disposed on said substrate such that said lead wires are drawn from said display unit outward to the outside of said sealing plate; and
   a linear bank formed along an adhesion zone defined on said substrate, said sealing plate having a periphery adhered to said adhesion zone, said linear bank extending across said lead wires in a region where said lead wires are disposed.

2. An organic EL display apparatus according to claim 1, wherein:
   said linear bank is made of a material which can be patterned.

3. An organic EL display apparatus according to claim 1, wherein:
   said linear bank is made of the same material as an insulating material disposed on said display unit.

4. An organic EL display apparatus according to claim 1, wherein:
   said linear bank is made of photoresist.

5. An organic EL display apparatus according to claim 1, wherein:
   said linear bank includes one or both side surfaces which define an inclined surface that declines from a top end to a bottom end of said side surface (s).

6. An organic EL display apparatus according to claim 5, wherein:
   said each lead line include one or both side surfaces which define an inclined surface that declines from the top end to the bottom end of said side surface(s) at least in the adhesion zone.

7. An organic EL display apparatus according to claim 1, wherein:
   said linear bank is thicker than said lead wires.

8. An organic EL display apparatus according to claim 1, wherein:
   said linear bank is positioned at a level from the surface of said substrate lower than the level of a bottom surface of a peripheral part of said sealing plate from the surface of said substrate when said sealing plate is adhered to said substrate.

9. An organic EL display apparatus according to claim 1, wherein:

said linear bank has a width which is one-half or less of the width of said adhesion zone.

10. An organic EL display apparatus according to claim 9, wherein:

said linear bank extends along said adhesion zone at a substantially central position of said adhesion zone in a width direction.

11. An organic EL display apparatus according to claim 1, comprising a plurality of said linear banks which extend substantially in parallel with one another.

12. An organic EL display apparatus according to claim 11, wherein:

said linear banks include two or more linear banks which are discontinuously formed in a lengthwise direction, and said two or more linear banks are disposed in a staggered configuration such that at least one linear bank exists when viewed from a direction orthogonal to a direction in which said adhesion zone extends.

* * * * *